United States Patent
Narayan et al.

(10) Patent No.: US 8,188,792 B1
(45) Date of Patent: May 29, 2012

(54) TECHNIQUES FOR CURRENT MIRROR CIRCUITS

(75) Inventors: Sriram Narayan, Pleasanton, CA (US); Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/889,772

(22) Filed: Sep. 24, 2010

(51) Int. Cl.
*H03F 3/45* (2006.01)
(52) U.S. Cl. ........................................ 330/257; 323/315
(58) Field of Classification Search .................. 330/257, 330/288; 323/315, 316
See application file for complete search history.

(56) References Cited

U.S. PATENT DOCUMENTS

| | | | |
|---|---|---|---|
| 4,550,284 A | 10/1985 | Sooch | |
| 7,183,852 B2 * | 2/2007 | Abe | 330/257 |
| 7,250,819 B2 * | 7/2007 | Kelly et al. | 330/257 |
| 7,274,256 B2 * | 9/2007 | Ricotti | 330/255 |

* cited by examiner

*Primary Examiner* — Henry Choe
(74) *Attorney, Agent, or Firm* — Steven J. Cahill

(57) ABSTRACT

A circuit includes a current mirror circuit and first and second transistors coupled as a differential pair. A first input voltage is provided to a control input of the first transistor. A second input voltage is provided to a control input of the second transistor. The current mirror circuit includes a third transistor, a fourth transistor coupled to the third transistor, and a fifth transistor coupled in series with the fourth transistor. The third transistor provides a current through the differential pair that is proportional to a current through the fourth transistor. A control input of the fourth transistor is coupled between the fifth transistor and a source of current.

20 Claims, 7 Drawing Sheets

TECHNIQUES FOR CURRENT MIRROR CIRCUITS

BACKGROUND

The present invention relates to electronic circuits, and more particularly, to techniques for current mirror circuits.

FIG. 1A illustrates a prior art differential amplifier circuit 100. Differential amplifier circuit 100 includes load circuit 101 and n-channel field-effect transistors 102-105. Transistors 102-103 are coupled as a differential pair of transistors. Input voltage VINN is provided to the gate of transistor 102, and input voltage VINP is provided to the gate of transistor 103. Load circuit 101 is coupled to the drains of transistors 102-103. Transistors 104-105 are a current mirror. The gate of transistor 105 is coupled to its drain and to the gate of transistor 104. Transistor 105 receives a bias current IBIAS from a circuit that is not shown in FIG. 1A. The drain voltage VTL of transistor 104 is controlled by the common mode voltage VCM of input voltages VINN and VINP.

The transistor 104 should be in strong saturation to generate a current ITAIL that is proportional to the current through transistor 105. In differential amplifier circuit 100, the common mode voltage VCM of input voltages VINN and VINP may decrease enough to cause transistor 104 to exit saturation. If transistor 104 is not in saturation, or if the drain-to-source voltage of transistor 104 is not equal to the drain-to-source voltage of transistor 105, the tail current ITAIL through transistor 104 may not be proportional to the current through transistor 105. The size of transistor 104 can be increased to reduce its saturation voltage. However, it may be undesirable to provide a transistor 104 that is large enough to maintain a proportional current through transistor 104 for an expected variation in the common mode voltage VCM of input voltages VINN and VINP.

FIG. 1B is a graph of the current ITAIL through transistor 104 as a function of the common mode voltage VCM of input voltages VINN and VINP in differential amplifier circuit 100. The current ITAIL through transistor 104 is shown in microamps in FIG. 1B, and the common mode voltage VCM is shown in volts in FIG. 1B. Three curves 111-113 are shown in FIG. 1B for the current ITAIL through transistor 104. Each of the curves 111-113 represents the current ITAIL during the operation of differential amplifier circuit 100 at different temperatures or different electrical parameters that are caused by variations in the process used to fabricate differential amplifier circuit 100.

Curve 111 represents the current ITAIL through transistor 104 at a high temperature (e.g., 125° C.) and a fast process of differential amplifier circuit 100. Curve 113 represents the current ITAIL through transistor 104 at a low temperature (−40° C.) and a slow process of differential amplifier circuit 100. Curve 112 represents intermediate values for the temperature and the process of differential amplifier circuit 100.

In the example of FIG. 1B, the current IBIAS through transistor 105 equals 100 microamps, and transistors 104 and 105 have the same width-to-length channel ratios. Ideally, the current ITAIL through transistor 104 should equal the current IBIAS through transistor 105. However, as shown in FIG. 1B with respect to curves 111-112, differential amplifier circuit 100 only generates a current ITAIL through transistor 104 that is within about +/−5% of 100 microamps within a range of about 170 millivolts of the common mode voltage VCM. Using curve 112 as an example, curve 112 only stays between 105 and 95 microamps between about 0.8 volts and about 0.97 volts, as shown by the vertical dotted lines in FIG. 1B. Curve 113 does not reach 100 microamps between 0 volts and 1 volt of VCM.

BRIEF SUMMARY

According to some embodiments, a circuit includes a current mirror circuit and first and second transistors coupled as a differential pair. A first input voltage is provided to a control input of the first transistor. A second input voltage is provided to a control input of the second transistor. The current mirror circuit includes a third transistor, a fourth transistor coupled to the third transistor, and a fifth transistor coupled in series with the fourth transistor. The third transistor provides a current through the differential pair that is proportional to a current through the fourth transistor. A control input of the fourth transistor is coupled between the fifth transistor and a source of current.

Various objects, features, and advantages of the present invention will become apparent upon consideration of the following detailed description and the accompanying drawings.

DETAILED DESCRIPTION

Figure 2:
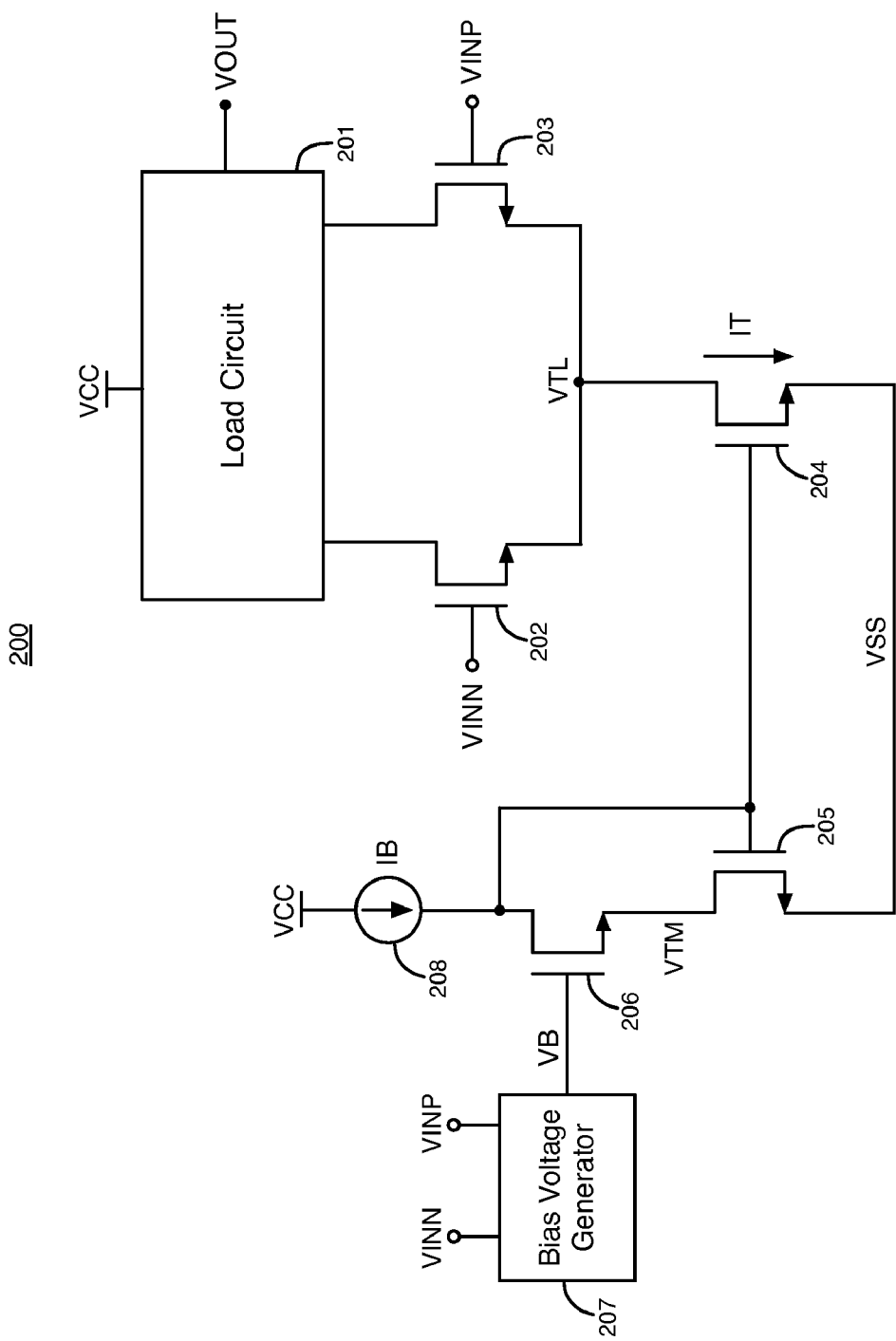
FIG. 2 illustrates an example of a differential amplifier circuit, according to an embodiment of the present invention.

FIG. 2 illustrates an example of a differential amplifier circuit 200, according to an embodiment of the present invention. Differential amplifier circuit 200 includes load circuit 201, n-channel metal oxide semiconductor field-effect transistors (MOSFETs) 202-206, bias voltage generator circuit 207, and current source circuit 208. Transistors 202-203 are coupled as a differential pair of transistors. Input voltage VINN is provided to the gate of transistor 202, and input voltage VINP is provided to the gate of transistor 203. Input voltages VINN and VINP together form a differential input voltage signal. According to another embodiment, the 5 n-channel MOSFETs 202-206 are replaced with 5 p-channel MOSFETs.

Load circuit 201 is coupled to the drains of transistors 202-203. Load circuit 201 can, for example, have passive circuits such as resistors, active circuits such as transistors, or any combination of passive and active circuits. As a specific example that is not intended to be limiting, load circuit 201 may have a first resistor coupled between a supply voltage node at supply voltage VCC and the drain of transistor 202, and a second resistor coupled between the supply voltage node and the drain of transistor 203.

Transistors 204-206 are coupled as a current mirror circuit. The drain of transistor 204 is coupled to the sources of transistors 202-203. The sources of transistors 204-205 are coupled to a node at a ground voltage VSS. The gate of transistor 204 is coupled to the gate of transistor 205. The drain of transistor 205 is coupled to the source of transistor 206. Transistors 205-206 are coupled together in series. The drain of transistor 206 is coupled to the gates of transistors 204-205. The drain of transistor 206 is coupled to current source 208. Transistor 206 receives a bias current IB from current source 208. Current source 208 is a constant current source. The current IB generated by current source 208 can be programmable.

Differential amplifier circuit 200 amplifies the differential input voltage signal formed by input voltages VINN and VINP to generate an output voltage signal VOUT. VOUT is shown as being generated by load circuit 201 in FIG. 2. VOUT may, for example, be generated between load circuit 201 and one or both of transistors 202-203. VOUT may be single-ended or differential.

Figures 3A, 3B:
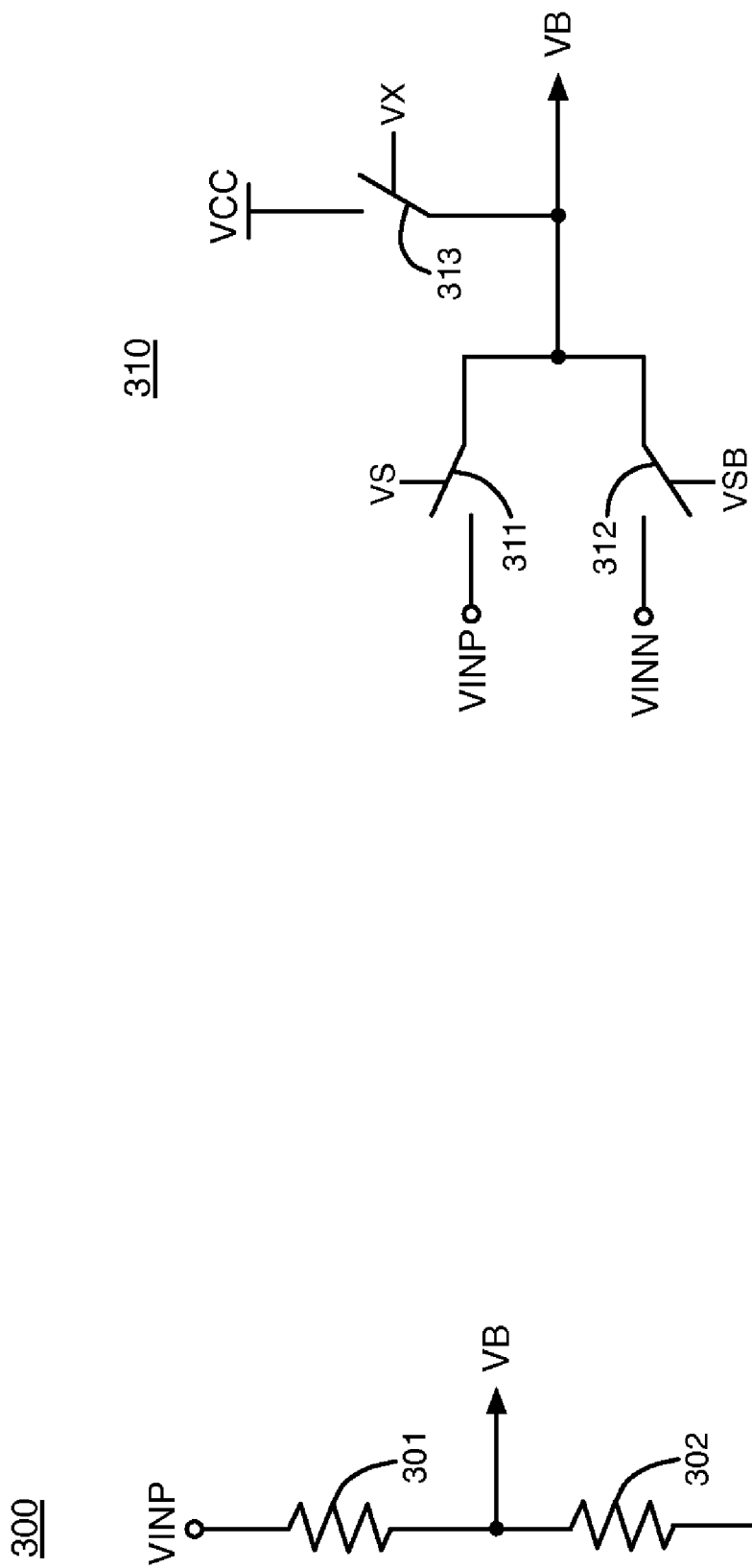
FIG. 3A illustrates a first example of a bias voltage generator circuit that can be used to implement the bias voltage generator circuit shown in FIG. 2.
FIG. 3B illustrates another example of a bias voltage generator circuit that can be used to implement the bias voltage generator circuit of FIG. 2.

Bias voltage generator circuit 207 generates a bias voltage VB based on input voltages VINN and VINP. The common mode voltage VCM of the differential input voltage signal formed by voltages VINN and VINP is equal to the average voltage of voltages VINN and VINP. Bias voltage generator circuit 207 generates a bias voltage VB that is equal to the common mode voltage VCM of the differential input voltage signal formed by voltages VINN and VINP. FIGS. 3A and 3B illustrate examples of bias voltage generator circuit 207.

FIG. 3A illustrates a first example of a bias voltage generator circuit 300 that can be used to implement bias voltage generator circuit 207. Bias voltage generator circuit 300 includes resistors 301-302. Resistors 301-302 are coupled to form a resistor divider between voltages VINN and VINP. Voltage VINP is provided to a first terminal of resistor 301. Voltage VINN is provided to a first terminal of resistor 302. Resistors 301 and 302 are coupled together at their second terminals. Resistor 301 has the same resistance as resistor 302. Therefore, a bias voltage VB that equals the common mode voltage VCM of voltages VINP and VINN is generated between resistors 301-302 at their second terminals, as shown in FIG. 3A. The impedance of the resistive network 301-302 should be high enough to not load the VINP and VINN nodes.

In some differential amplifiers, the first input voltage provided to the gate of a first transistor in the differential pair remains constant, and the second input voltage provided to the gate of a second transistor in the differential pair varies above and below the first input voltage. The first input voltage equals the common mode voltage of the second input voltage. FIG. 3B illustrates an example of an implementation of bias voltage generator circuit 207 that can be used in a differential amplifier circuit having a first input voltage to the differential pair of transistors that equals the common mode voltage of the second input voltage to the differential pair of transistors.

FIG. 3B illustrates an example of a bias voltage generator circuit 310 that can be used to implement bias voltage generator circuit 207. Bias voltage generator circuit 310 includes three switch circuits 311-313. Voltage VINP is provided to a first terminal of switch circuit 311. Voltage VINN is provided to a first terminal of switch circuit 312. Switch circuits 311-312 are coupled together at their second terminals. Circuit 310 generates a bias voltage VB at the second terminals of switch circuits 311-312. Switch circuits 311-313 may be implemented, for example, by transistors.

A first control signal VS is provided to a control input of switch circuit 311, and a second control signal VSB is provided to a control input of switch circuit 312. Switch circuit 311 is either open or closed depending on the state of the first control signal VS. Switch circuit 312 is either open or closed depending on the state of the second control signal VSB. An inverter circuit (not shown) drives the second control signal VSB to the logical inverse of the first control signal VS. When bias voltage generator circuit 310 is operating, one of switch circuits 311 or 312 is closed, and one of switch circuits 311 or 312 is open. Switch circuits 311-312 are never closed at the same time.

Bias voltage generator circuit 310 provides either voltage VINP or voltage VINN to its output as voltage VB. If voltage VINP is constant and equal to the common mode voltage of VINN, control signal VS closes switch circuit 311, control signal VSB opens switch circuit 312, and bias voltage generator circuit 310 provides voltage VINP to its output as voltage VB. If voltage VINN is constant and equal to the common mode voltage of VINP, control signal VS opens switch circuit 311, control signal VSB closes switch circuit 312, and bias voltage generator circuit 310 provides voltage VINN to its output as voltage VB.

A first terminal of switch circuit 313 is coupled to a supply voltage node at supply voltage VCC. A second terminal of switch circuit 313 is coupled to the second terminals of switch circuits 311-312. A third control signal VX is provided to a control input of switch circuit 313. During the normal operation of differential amplifier circuit 200, control signal VX is set to a state that causes switch circuit 313 to be open so that the gate of transistor 206 is decoupled from the supply voltage VCC. The gate of transistor 206 is not coupled to supply voltage VCC during the normal operation in order to achieve the benefits that transistor 206 provides in differential amplifier circuit 200, as described herein.

If control signal VX is set to a state that causes switch circuit 313 to be closed, bias voltage generator circuit 310 pulls voltage VB to the supply voltage VCC, causing transistor 206 to have a low drain-to-source resistance. Transistor 206 then functions like a low impedance conductor (operates in the linear region), and transistor 206 is effectively disabled.

Referring again to FIG. 2, transistor 204 has a width-to-length (W/L) channel ratio that is M times the width-to-length (W/L) channel ratio of transistor 205. M is a positive non-zero integer (e.g., 1, 2, 3, 4, 5, 6, 7, 8, etc.).

The current through transistors 205 and 206 equals the current IB generated by current source 208 when the gate voltage of transistor 205 is constant. The current mirror circuit that includes transistors 204-206 generates a tail current IT through transistor 204 that equals M times the current through transistor 205. Thus, the tail current IT through transistor 204 equals M×IB. The combined currents through transistors 202-203 equal the tail current IT through transistor 204.

Transistors 202 and 203 have the same width-to-length (W/L) channel ratios. The width-to-length (W/L) channel ratio of each of transistors 202-203 is referred to as WIN/LIN. Transistor 206 is designed to have a width-to-length (W/L) channel ratio that causes the current density through transistor 206 to equal the average current density through each of transistors 202 and 203. The width-to-length channel ratio of transistor 206 is selected based on the width-to-length channel ratios of transistors 202-203. The width-to-length channel ratio $W/L_{206}$ of transistor 206 is selected using equation (1) shown below.

$$W/L_{206} = (2 \times WIN)/(M \times LIN) \qquad (1)$$

M is in the denominator of equation (1), because the combined currents through transistors 202-203 equal M times the current through transistor 206. 2 is in the numerator of equation (1), because each of transistors 202 and 203 conducts on average one-half of the current through transistor 204 over time.

As mentioned above, bias voltage generator circuit 207 generates a bias voltage VB that equals the common mode voltage VCM of input voltages VINN and VINP, and the current density through transistor 206 equals the average current density through each of transistors 202-203. Also, each of transistors 202, 203, and 206 has the same threshold voltage. Therefore, the voltage VTM at the source of transistor 206 equals the voltage VTL at the sources of transistors 202-203. As a result, the drain-to-source voltage $V_{DS}$ of transistor 204 equals the drain-to-source voltage $V_{DS}$ of transistor 205.

Transistor 205 stays in saturation during the operation of differential amplifier circuit 200 as long as the $V_{DS}$ of transistor 205 is greater than or equal to the saturation voltage $V_{DSAT}$ of transistor 205. Transistors 204 and 205 have the same threshold voltages and the same saturation voltages $V_{DSAT}$. Transistor 204 stays in saturation during the operation of differential amplifier circuit 200 as long as transistor 205 is in saturation, because the $V_{DS}$ of transistor 204 equals the $V_{DS}$ of transistor 205, and the gates of transistors 204-205 are coupled together. When transistors 204-205 are in saturation, the current IT through transistor 204 is proportional to the current IB through transistor 205, and the current IT through transistor 204 equals M times the current IB through transistor 205. However, variations in the temperature, the supply voltage VCC, and the process of differential amplifier 200 may cause the current IT through transistor 204 to be greater than or less than M×IB, even when transistors 204-205 are in saturation.

A transient in voltage VB may cause the current mirror circuit formed by transistors 204-206 to stop generating a current IT that equals M×IB. For example, if a transient causes voltage VB to decrease so that voltage VB no longer equals VCM, transistor 206 may enter the linear region or turn off, reducing the current through transistor 204. Therefore, bias voltage generator circuit 207 should not generate transients in voltage VB.

Figure 4:
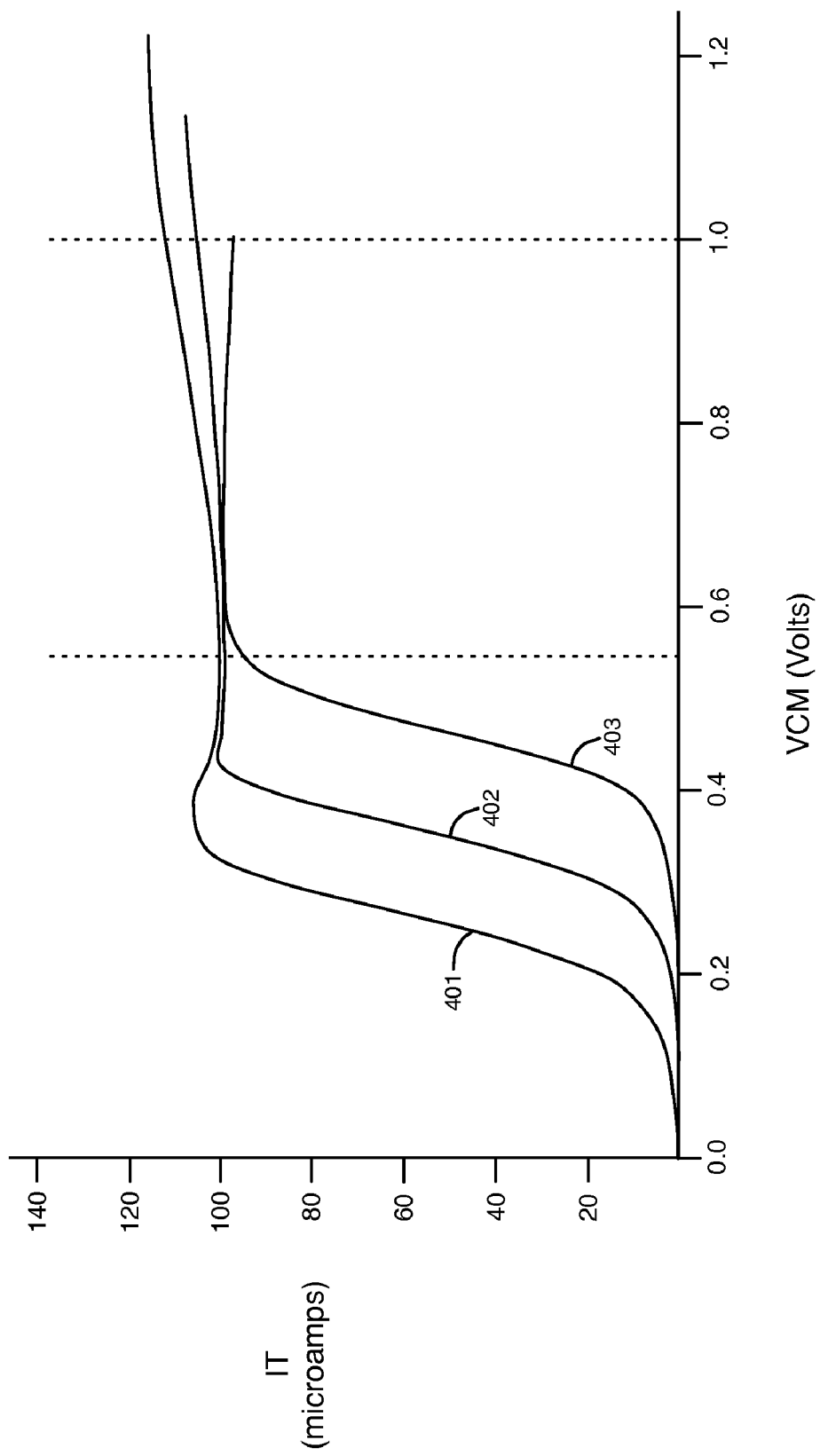
FIG. 4 is a graph that illustrates example values of the tail current in the differential amplifier circuit of FIG. 2 as a function of the common mode voltage of the input voltages.

FIG. 4 is a graph that illustrates example values of the tail current IT through transistor 204 as a function of the common mode voltage VCM of the input voltages VINN and VINP to differential amplifier circuit 200. The current IT through transistor 204 is shown in microamps in FIG. 4, and the common mode voltage VCM is shown in volts in FIG. 4. Three curves 401-403 are shown in FIG. 4 for the current IT through transistor 204. Each of the curves 401-403 represents the current IT during the operation of differential amplifier circuit 200 at different temperatures or different electrical parameters that are caused by variations in the process used to fabricate differential amplifier circuit 200. Curves 401-403 shown in FIG. 4 are merely examples that are not intended to limit the scope of the present invention.

Curve 401 represents the current IT through transistor 204 at a high temperature (e.g., 125° C.) and a fast process of differential amplifier circuit 200. Curve 403 represents the current IT through transistor 204 at a low temperature (−40° C.) and a slow process of differential amplifier circuit 200. Curve 402 represents intermediate values for the temperature and the process of differential amplifier circuit 200.

Figure 1A:
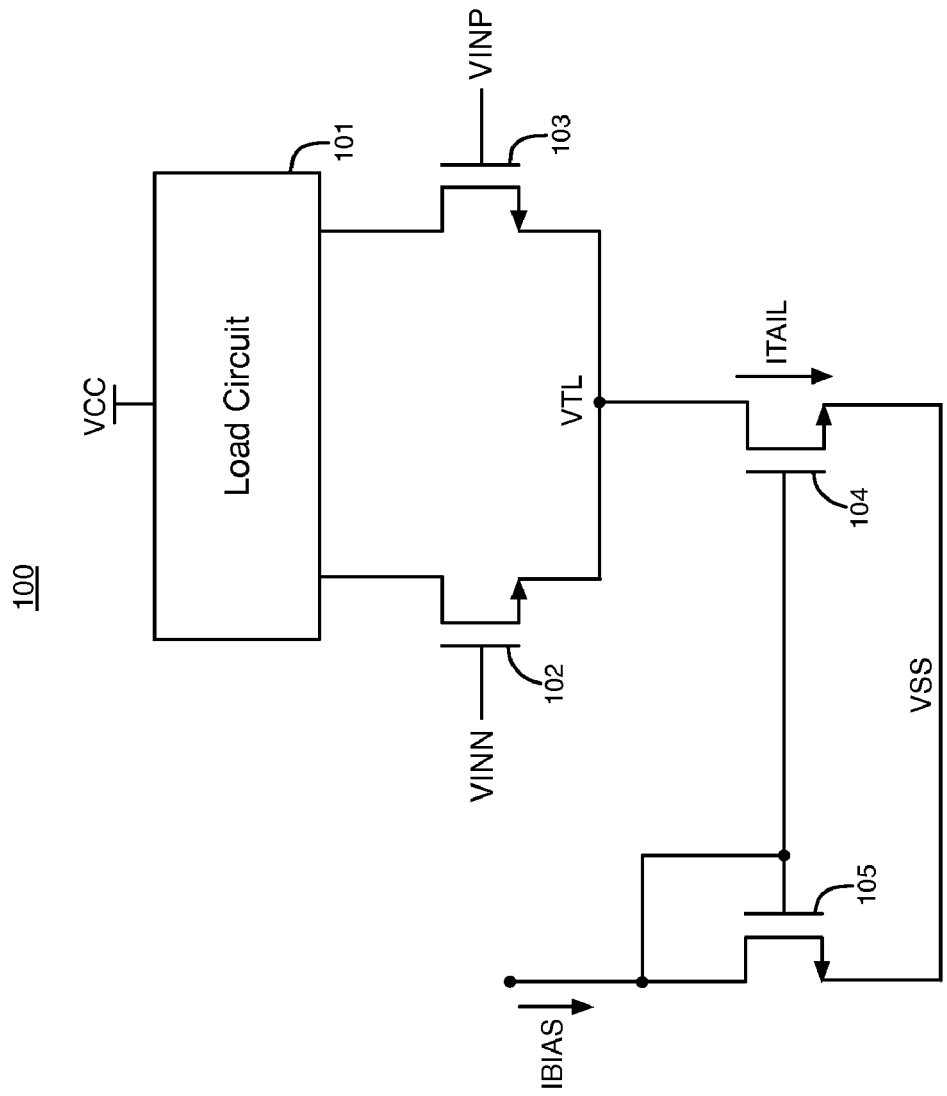
FIG. 1A illustrates a prior art differential amplifier circuit.
Figure 1B:
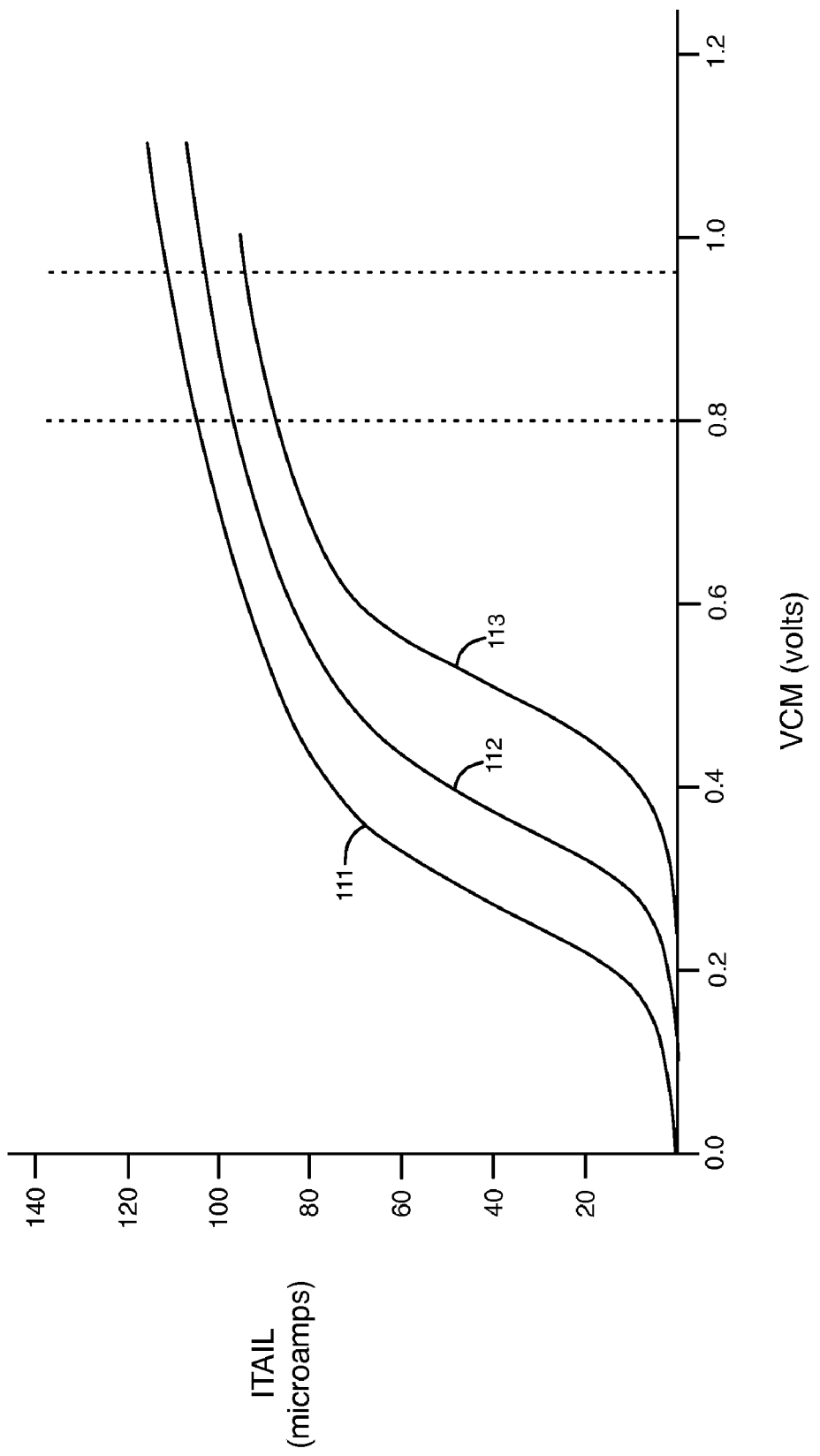
FIG. 1B is a graph of the tail current in the differential amplifier circuit of FIG. 1A as a function of the common mode voltage of the input voltages.

In the example used in FIG. 4, the current IB through transistor 205 equals 100 microamps. Also, in the example used in FIG. 4, M equals 1, and therefore, transistors 204 and 205 have the same width-to-length channel ratios. The current IT through transistor 204 equals or approximately equals the current IB through transistor 205, while transistors 204-205 are in saturation. As shown in FIG. 4 with respect to curves 402-403 between the vertical dotted lines, differential amplifier circuit 200 generates a current IT through transistor 204 that is within +/−5% of 100 microamps over a range of about 450 millivolts of the common mode voltage VCM from about 0.55 volts to about 1.0 volts. Thus, curves 402-403 remain within +/−5% of 100 microamps over more than two times the range of VCM compared to curves 111-112 shown in FIG. 1B. Curve 401 remains within +/−5% of 100 microamps over a range of about 400 millivolts.

Differential amplifier circuit 200 generates an accurate current IT through transistor 204 over a wider range of the common mode voltage VCM compared to the current ITAIL generated by differential amplifier circuit 100. Differential amplifier circuit 200 generates a current IT that equals M times the current through transistor 205 even if supply voltage VCC has a low voltage (e.g., 1.2 volts). A low supply voltage provides less voltage headroom to keep transistor 204 in saturation.

Differential amplifier circuit 200 produces a current IT through transistor 204 that equals M times the current through transistor 205 even when both of transistors 204-205 go into linear operation when the common mode voltage VCM decreases to a voltage that causes the drain-to-source voltage of transistor 205 to be less than $V_{DSAT}$. However, if transistors 204-205 are operated in the linear region, the power supply rejection ratio to ground VSS may be degraded. Differential amplifier circuit 200 does not require a cascode transistor, which provides more voltage headroom for transistors 204-205.

Figure 5:
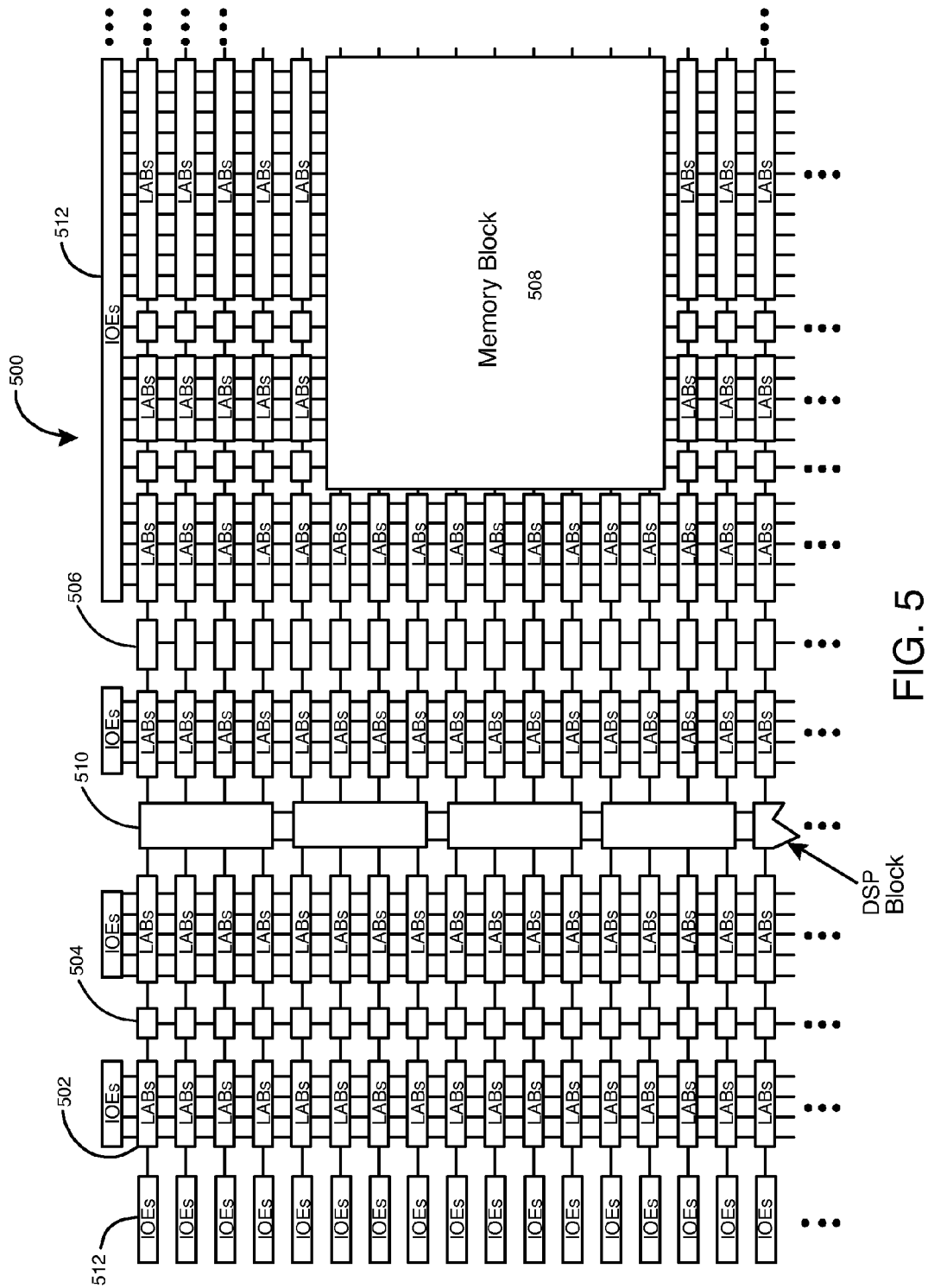
FIG. 5 is a simplified partial block diagram of a field programmable gate array (FPGA) that can include aspects of the present invention.

FIG. 5 is a simplified partial block diagram of a field programmable gate array (FPGA) 500 that can include aspects of the present invention. FPGA 500 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 500 includes a two-dimensional array of programmable logic array blocks (or LABs) 502 that are interconnected by a network of column and row interconnect conductors of varying length and speed. LABs 502 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 500 also includes a distributed memory structure including random access memory (RAM) blocks of varying sizes provided throughout the array. The RAM blocks include, for example, blocks 504, blocks 506, and block 508. These memory blocks can also include shift registers and first-in-first-out (FIFO) buffers.

FPGA 500 further includes digital signal processing (DSP) blocks 510 that can implement, for example, multipliers with add or subtract features. Input/output elements (IOEs) 512 located, in this example, around the periphery of the chip, support numerous single-ended and differential input/output standards. IOEs 512 include input and output buffers that are coupled to pins of the integrated circuit. The input and output buffers may include differential amplifier circuit 200 shown in FIG. 2. The pins are external terminals of the FPGA die that can be used to route, for example, input signals, output signals, and supply voltages between the FPGA and one or more external devices. It should be understood that FPGA 500 is described herein for illustrative purposes only and that the present invention can be implemented in many different types of integrated circuits.

Figure 6:
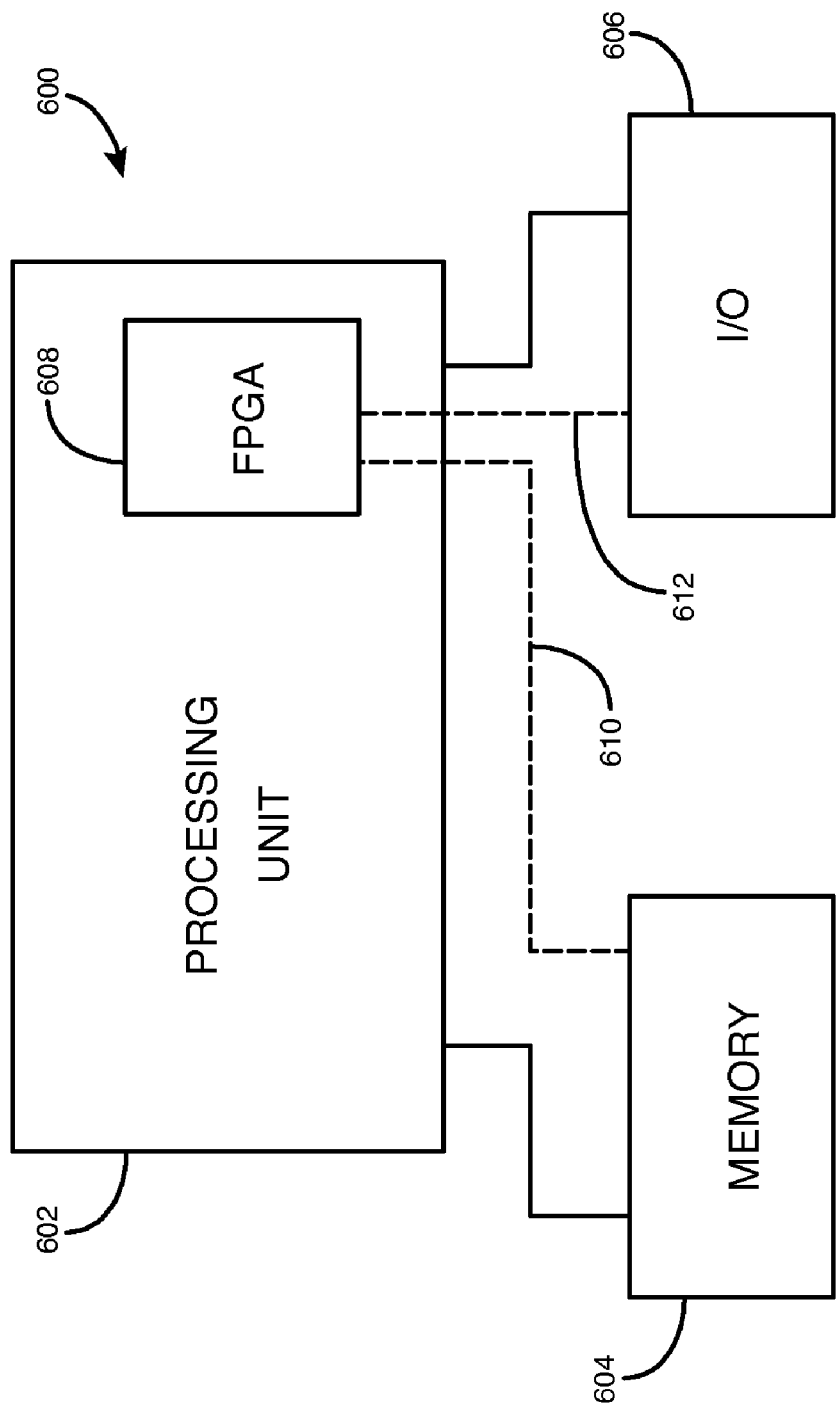
FIG. 6 shows a block diagram of an exemplary digital system that can embody techniques of the present invention.

The present invention can also be implemented in a system that has an FPGA as one of several components. FIG. 6 shows a block diagram of an exemplary digital system 600 that can embody techniques of the present invention. System 600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 600 can be provided on a single board, on multiple boards, or within multiple enclosures.

System 600 includes a processing unit 602, a memory unit 604, and an input/output (I/O) unit 606 interconnected together by one or more buses. According to this exemplary embodiment, an FPGA 608 is embedded in processing unit 602. FPGA 608 can serve many different purposes within the system of FIG. 6. FPGA 608 can, for example, be a logical building block of processing unit 602, supporting its internal and external operations. FPGA 608 is programmed to implement the logical functions necessary to carry on its particular role in system operation. FPGA 608 can be specially coupled to memory 604 through connection 610 and to I/O unit 606 through connection 612.

Processing unit 602 can direct data to an appropriate system component for processing or storage, execute a program stored in memory 604, receive and transmit data via I/O unit 606, or other similar functions. Processing unit 602 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 608 can control the logical operations of the system. As another example, FPGA 608 acts as a reconfigurable processor that can be reprogrammed as needed to handle a particular computing task. Alternatively, FPGA 608 can itself include an embedded microprocessor. Memory unit 604 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   first and second transistors coupled as a differential pair, wherein a first input voltage is provided to a control input of the first transistor, and a second input voltage is provided to a control input of the second transistor; and
   a current mirror circuit comprising a third transistor, a fourth transistor coupled to the third transistor, and a fifth transistor coupled in series with the fourth transistor, wherein the third transistor provides a current through the differential pair that is proportional to a current through the fourth transistor, and a control input of the fourth transistor is coupled between the fifth transistor and a source of current; and
   a bias voltage generator circuit that generates a bias voltage to be substantially equal to a common mode voltage of the first and the second input voltages, wherein the bias voltage is provided to a control input of the fifth transistor, and wherein the bias voltage generator circuit comprises a resistor divider circuit that receives the first and the second input voltages and that generates the bias voltage based on the first and the second input voltages.

2. The circuit of claim 1 wherein the source of current is a constant current source.

3. The circuit of claim 1 wherein the first and the second transistors are coupled to a load circuit.

4. The circuit of claim 1 wherein a width-to-length channel ratio of the third transistor is M times a width-to-length channel ratio of the fourth transistor, and a width-to-length channel ratio of the fifth transistor is 2/M times a width-to-length channel ratio of the first transistor.

5. The circuit of claim 1 wherein the control input of the fourth transistor is coupled to a control input of the third transistor.

6. The circuit of claim 1 wherein the first, the second, the third, the fourth, and the fifth transistors are n-channel field-effect transistors.

7. The circuit of claim 6 wherein a gate of the fourth transistor is coupled to a gate of the third transistor and to a drain of the fifth transistor, and a drain of the fourth transistor is coupled to a source of the fifth transistor, and a drain of the third transistor is coupled to sources of the first and the second transistors.

8. The circuit of claim 1 wherein the circuit is in a programmable logic integrated circuit.

9. A circuit comprising:
   a differential pair comprising first and second transistors, wherein a first input voltage is provided to a control input of the first transistor, and a second input voltage is provided to a control input of the second transistor;
   a current mirror circuit comprising a third transistor coupled to the first and the second transistors, a fourth transistor, and a fifth transistor coupled to the fourth transistor, wherein a control input of the fourth transistor is coupled to a control input of the third transistor, a bias voltage is provided to a control input of the fifth transistor, and the bias voltage is set to a common mode voltage of the first and the second input voltages; and
   a bias voltage generator circuit that generates the bias voltage based on the first and the second input voltages, wherein the bias voltage generator circuit comprises a first switch circuit coupled to receive the first input voltage and a second switch circuit coupled to receive the second input voltage, and wherein the first and the second switch circuits are coupled to the control input of the fifth transistor.

10. The circuit of claim 9 wherein the fourth and the fifth transistors are coupled together in series, and the control input of the fourth transistor is coupled between the fifth transistor and a source of current.

11. The circuit of claim 9 further comprising:
a load circuit coupled to the first and the second transistors.

12. The circuit of claim 9 wherein the control input of the fourth transistor is coupled to a drain of the fifth transistor, wherein a drain of the fourth transistor is coupled to a source of the fifth transistor, and a drain of the third transistor is coupled to sources of the first and the second transistors.

13. The circuit of claim 10 wherein the source of current is a constant current source.

14. The circuit of claim 9 wherein the bias voltage generator circuit comprises a third switch circuit coupled between a node at a supply voltage and the control input of the fifth transistor.

15. The circuit of claim 9 wherein a size of the third transistor is M times a size of the fourth transistor, and a size of the fifth transistor is 2/M times a size of the first transistor.

16. A method comprising:
amplifying a differential input signal using first and second transistors coupled as a differential pair;
generating a first current through the differential pair and a third transistor; and
generating a second current through fourth and fifth transistors, wherein the third, the fourth, and the fifth transistors are coupled as a current mirror circuit, the first current is proportional to the second current, and a control input of the fourth transistor is coupled between the fifth transistor and a source of current; and
generating a bias voltage based on a common mode voltage of the differential input signal at a control input of the fifth transistor, wherein the bias voltage is substantially equal to the common mode voltage, wherein a resistor divider circuit receives first and second input voltages that indicate the differential input signal, and wherein the resistor divider circuit generates the bias voltage based on the first and the second in input voltages.

17. The method of claim 16:
wherein the source of current is a constant current source.

18. The method of claim 16 wherein the control input of the fourth transistor is coupled to a control input of the third transistor and to a drain of the fifth transistor, and a drain of the fourth transistor is coupled to a source of the fifth transistor, and a drain of the third transistor is coupled to sources of the first and the second transistors.

19. The method of claim 16 wherein a size of the third transistor is M times a size of the fourth transistor, and a size of the fifth transistor is 2/M times a size of the first transistor.

20. The method of claim 16 wherein the fourth and the fifth transistors are coupled together in series, and the control input of the fourth transistor is coupled to a control input of the third transistor.

* * * * *